(12) United States Patent
Go et al.

(10) Patent No.: US 7,463,659 B2
(45) Date of Patent: Dec. 9, 2008

(54) CAN-TYPE OPTICAL TRANSMITTING MODULE UTILIZING A LASER DIODE WITH IMPEDANCE MATCHING RESISTORS

(75) Inventors: Hisao Go, Yokohama (JP); Eiji Tsumura, Yokohama (JP); Akihiro Moto, Yokohama (JP); Kiyoshi Kato, Yokohama (JP); Toshiaki Kihara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 104 days.

(21) Appl. No.: 10/887,328

(22) Filed: Jul. 9, 2004

(65) Prior Publication Data

US 2005/0047460 A1 Mar. 3, 2005

(30) Foreign Application Priority Data

Jul. 9, 2003 (JP) ............................. 2003-272563

(51) Int. Cl.
*H01S 5/022* (2006.01)
*H01L 23/36* (2006.01)

(52) U.S. Cl. ........................................ 372/36; 372/33
(58) Field of Classification Search .............. 372/43.01, 372/33, 36
See application file for complete search history.

(56) References Cited

U.S. PATENT DOCUMENTS

| | | | |
|---|---|---|---|
| 6,044,097 A * | 3/2000 | Kawamura et al. | 372/38.01 |
| 6,703,561 B1 * | 3/2004 | Rosenberg et al. | 174/541 |
| 6,836,492 B2 * | 12/2004 | Ido et al. | 372/36 |
| 6,996,304 B2 * | 2/2006 | Aronson et al. | 385/14 |
| 2002/0167977 A1 | 11/2002 | Nakabayashi et al. | |
| 2004/0037334 A1 | 2/2004 | Funada et al. | |
| 2004/0202214 A1 * | 10/2004 | Aronson et al. | 372/38.02 |
| 2005/0013561 A1 * | 1/2005 | Kuhara et al. | 385/92 |
| 2005/0105911 A1 * | 5/2005 | Keh et al. | 398/138 |

FOREIGN PATENT DOCUMENTS

| | | |
|---|---|---|
| JP | 06-318763 | 11/1994 |
| JP | 07-240565 | 9/1995 |

(Continued)

OTHER PUBLICATIONS

Japanese Office Action issued in Japanese Patent Application No. JP 2004-202396 dated on Jul. 8, 2008.

*Primary Examiner*—Minsun Harvey
*Assistant Examiner*—Marcia A. Golub
(74) *Attorney, Agent, or Firm*—McDermott Will & Emery LLP

(57) ABSTRACT

The present invention provides an optical transmitting module, in which a laser diode and a termination resistor are provided without sizing up the package thereof and degrading the thermal characteristic due to heat generation by the termination resistor. The transmitting module of the present invention includes the semiconductor laser diode, and the resistor. The laser diode is mounted on the side surface of the block extruding from the base. The resistor is mounted on the flat side portion of the end of the lead. The lead is secured in the through hole provided in the base with seal glass being filled in the gap between the through hole and the lead. In the transmitting module thus configured, the laser diode is thermally isolated from the heat generated by the resistor due to the seal glass.

7 Claims, 13 Drawing Sheets

FOREIGN PATENT DOCUMENTS

| | | |
|---|---|---|
| JP | 63-107185 | 5/1998 |
| JP | 2000-028872 | 1/2000 |
| JP | 2000-353846 | 12/2000 |
| JP | 2002-374028 | 12/2002 |
| JP | 2003-037329 | 2/2003 |
| JP | 2003-229629 | 8/2003 |
| JP | 2003-332667 | 11/2003 |

\* cited by examiner

Tmax=96.42°C

Tmax=98.15°C

T=95.65°C  Tmax=145.6°C

T=95.65°C

CAN-TYPE OPTICAL TRANSMITTING MODULE UTILIZING A LASER DIODE WITH IMPEDANCE MATCHING RESISTORS

BACKGROUND OF THE INVENTION

1. Field of the Invention

The present invention relates to an optical transmitting module, in particular, an optical transmitting module having a CAN type package.

2. Related Prior Art

Recently, it is requested that a terminator should be installed within an optical transmitting module or an optical transmitting sub-assembly to match an input impedance thereof to the line impedance as the transmission speed in the optical communication system which increases and reaches to giga-hertz (GHz) band. Moreover, it is generally applied for an optical active device, such as a semiconductor laser diode and a pre-amplifier, to dissipate larger power in order to operate in such high speed signal.

In the optical transmitting module or the optical transmitting sub-assembly having a CAN type package, the miniaturization of the package may be easily carried out. On the other hand, to install the terminator within the CAN type package is so hard because of its small sized package. One exemplary configuration is known that a block is formed on a stem of the CAN type package, and the laser diode is mounted on the block via a substrate made of aluminum nitride (AlN), which operates as a heat sink. In addition to the laser diode disposed on the heat sink, a thin film metal resistor is also formed on the AlN substrate, and electrical connection from the resistor to the lead of the package and the semiconductor are carried out by micro-strip lines.

According to such configuration of the optical transmitting module with the CAN type package, since the termination resistor can be provided within the package as a thin film resistor, the module may operate and emit light in GHz band with quality.

However, in such optical transmitting module, an insulating material having good thermal conductivity must be prepared to form the thin film resistor and to mount the laser diode thereon. Such materials are so restricted, in the present circumstances, only the aluminum nitride is known, but is so costly. Moreover, to use the thin film configuration must be taken the parasitic capacitance attributed to the device into consideration.

Therefore, one object of the present invention is to provide a arrangement of the optical transmitting module that installs the laser diode and the termination resistor therein, and shows a superior high frequency performance without using any particular materials or configurations.

SUMMARY OF THE INVENTION

One aspect of the present invention relates to an optical transmitting module. The optical transmitting module of the present invention includes a semiconductor laser diode, a resistor and a CAN type package enclosing the laser diode and the resistor therein. The package has a stem comprising a base, a block and a lead. The block provided on the base has a side surface the laser diode is mounted thereon. On the other hand, the resistor is mounted on the lead. One terminal of the resistor is connected to the lead and the other terminal of the resistor is connected to the laser diode. Thus, the laser diode is applied a drive signal via the resistor. In the present invention, the lead is thermally and electrically isolated from the base, accordingly, heat generated by the resistor can not transferred to the block, and does not affect the thermal condition of the laser diode.

An end portion of the lead may have a flat side surface where the resistor is mounted thereon. The flat side surface of the lead and the side surface of the block may be parallel to each other. Accordingly, an electrical connection between the resistor and the laser diode, and that between the resistor and the lead can be easily carried out. Further, the base and the block in the stem may be formed integrally and made of SPC or Kovar.

The optical transmitting module may be further include a heat sink with a metal film on a surface thereof, the laser diode may be mounted on the side surface of the block via the heat sink such that a electrode, generally a cathode thereof, may face to and be fixed to the metal film. The other terminal of the resistor may be connected to laser diode via the metal film on the heat sink.

The optical transmitting module may further include a post made of an electrically conductive material. The post may be disposed immediate side of the laser diode to shorten a length of the bonding wire connecting the other terminal of the laser diode thereto.

According to another aspect of the present invention, the transmitting module may further include the second resistor and the second lead that is also thermally and electrically isolated from the base. An end portion of the second lead may have a flat side surface for mounting the second resistor thereon. The flat side surface of the second lead may be parallel to the side surface of the block such that the wire-bonding between the laser diode and the second resistor may be easily carried out. According to the present configuration having two resistors each connected to respective leads, a differential driving of the laser diode may be easily realized by supplying two signals complementary with respect to each other to respective leads. Accordingly, high frequency performance of the module can be enhanced.

Still another aspect of the present invention relates to an optical transmitting sub-assembly (TOSA) that comprises the aforementioned optical transmitting module, an alignment member and a sleeve assembly. The sleeve assembly includes a sleeve cover, a sleeve, a stub and a bush. The stub is disposed in one end of the sleeve, and is rigidly fixed thereto by press-fitting the bush between the sleeve and the sleeve cover. The alignment member, configured between the optical transmitting module and the sleeve assembly, enables to optically align the sleeve assembly with the laser diode within the optical transmitting module.

Figure 11A:
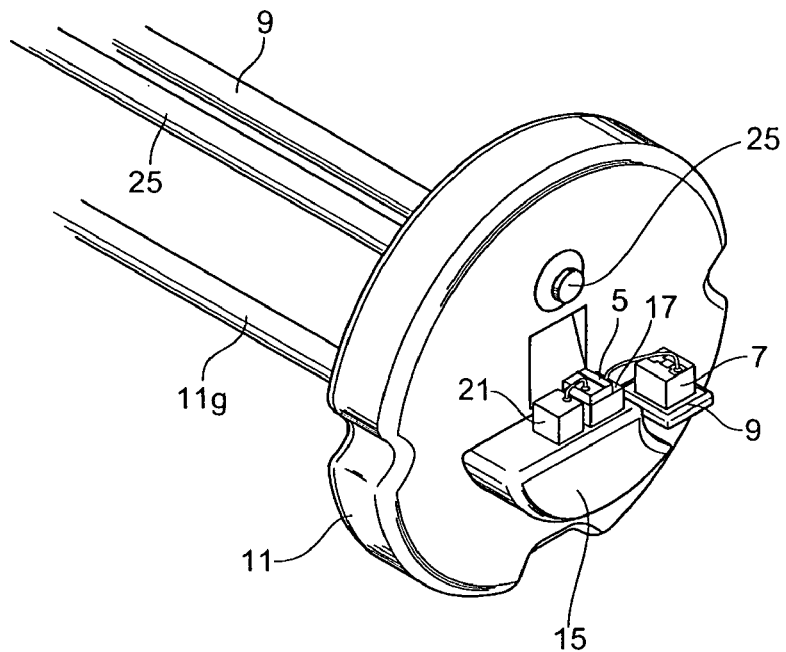
Figure 11B:
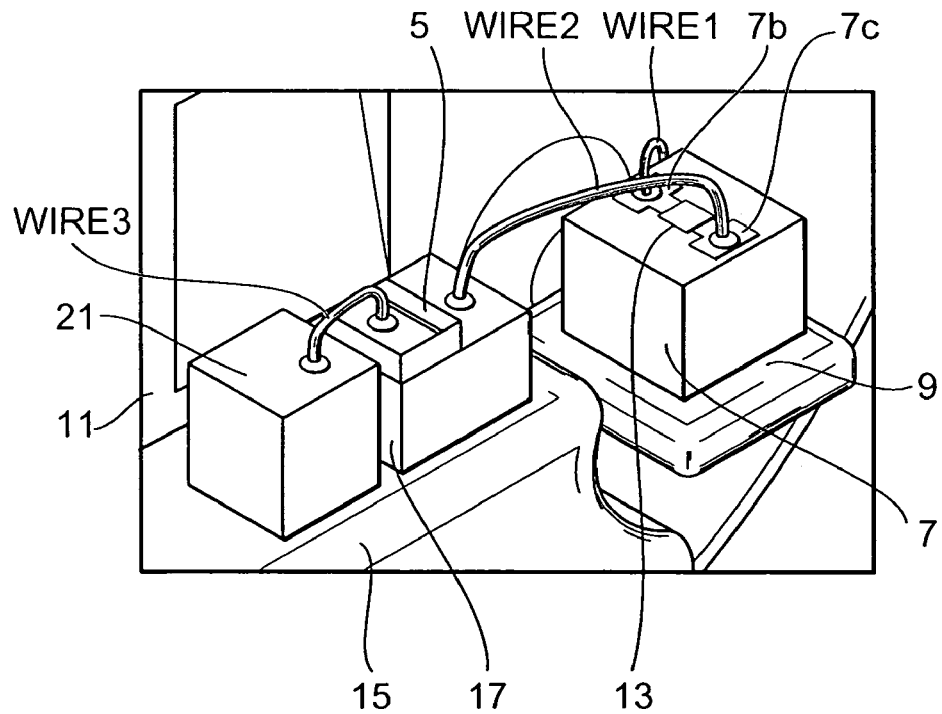
Figure 12A:
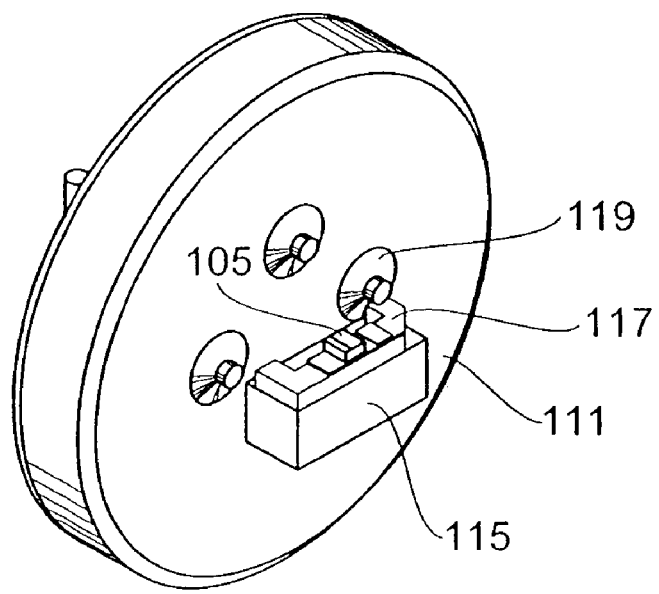
Figure 12B:
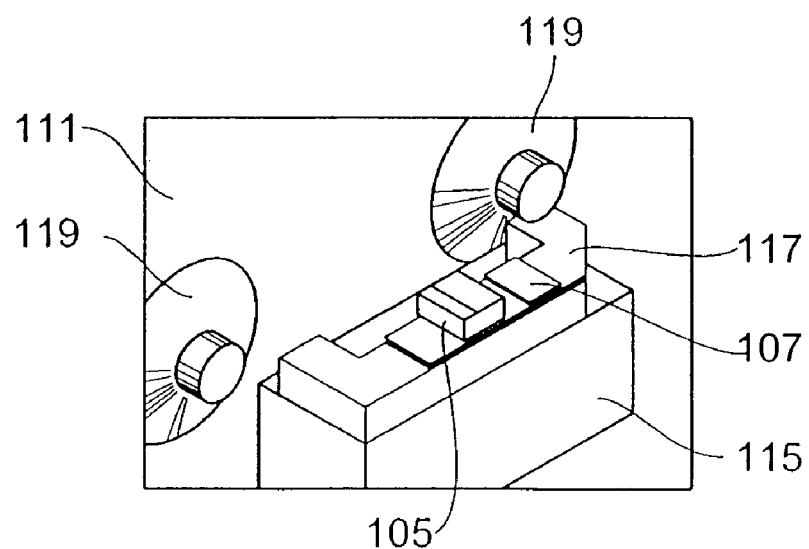
Figure 13A:
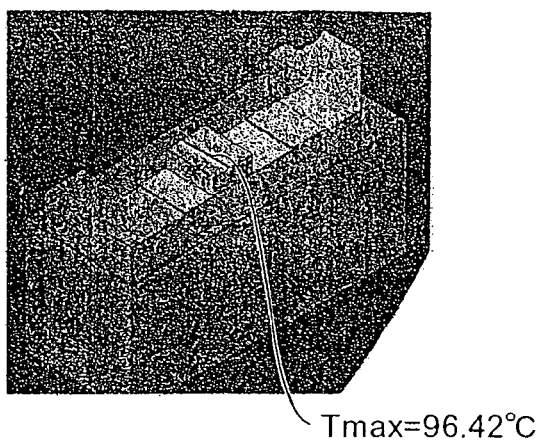
Figure 13B:
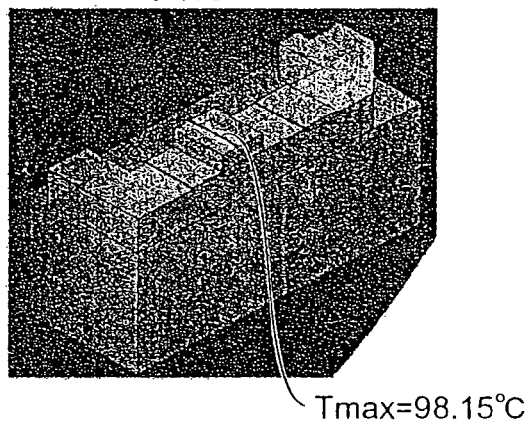
Figure 13C:
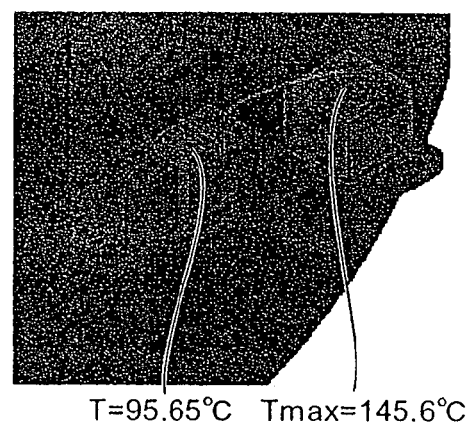
Figure 13D:
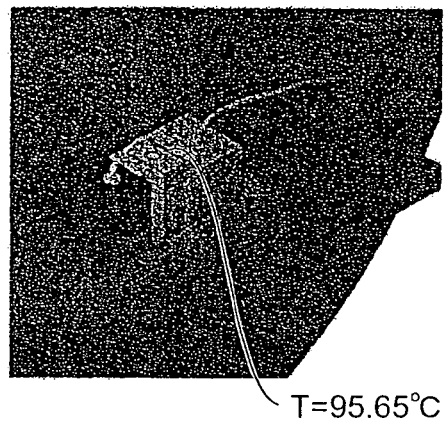

From FIG. 7 to FIG. 10 show process steps for manufacturing the optical transmitting module of the second embodiment;

FIG. 11A shows a thermal analysis model of the present transmitting module and FIG. 11B is a magnified view showing the primary portion in FIG. 11A;

FIG. 12A shows a thermal analysis model of a conventional transmitting module, and FIG. 12B is a magnified view showing the primary portion in FIG. 12B; and FIG. 13A is a simulation result for the conventional transmitting module; FIG. 13B is a simulation result of the conventional module when the block and the base are integrally formed; FIG. 13C is a simulation result of the present transmitting module; and FIG. 13D is a simulation result of the present module when the heat generation by the chip resistor is ignored.

DETAILED DESCRIPTION OF PREFERRED EMBODIMENTS

Next, preferred embodiments of the present invention will be described in detail as referring to accompanying drawings. In the specification and drawings, same elements will be referred by same numerals or symbols without over lapping explanations.

First Embodiment

Figure 1:
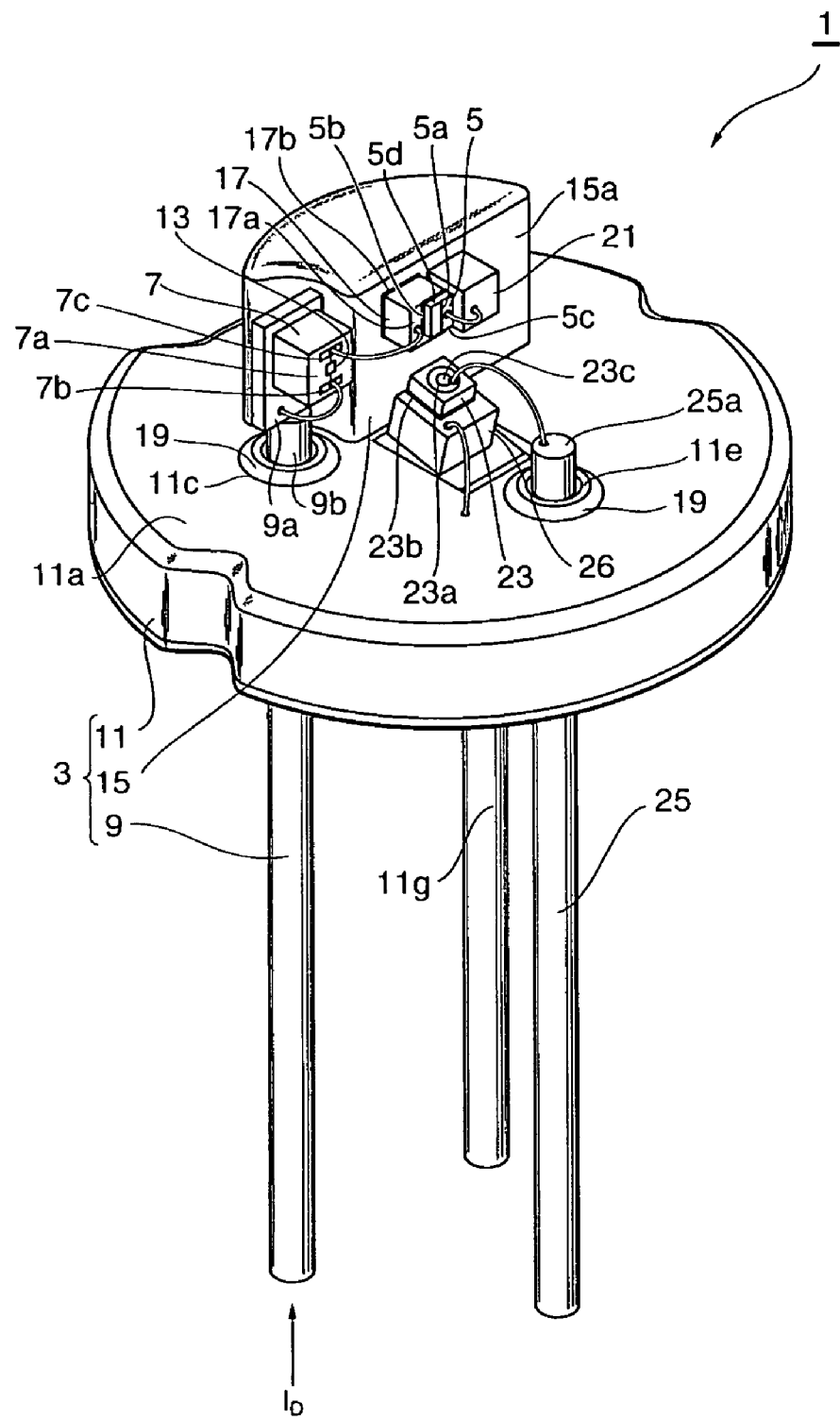
FIG. 1 is a perspective view showing an optical transmitting module according to the first embodiment.
Figure 2:
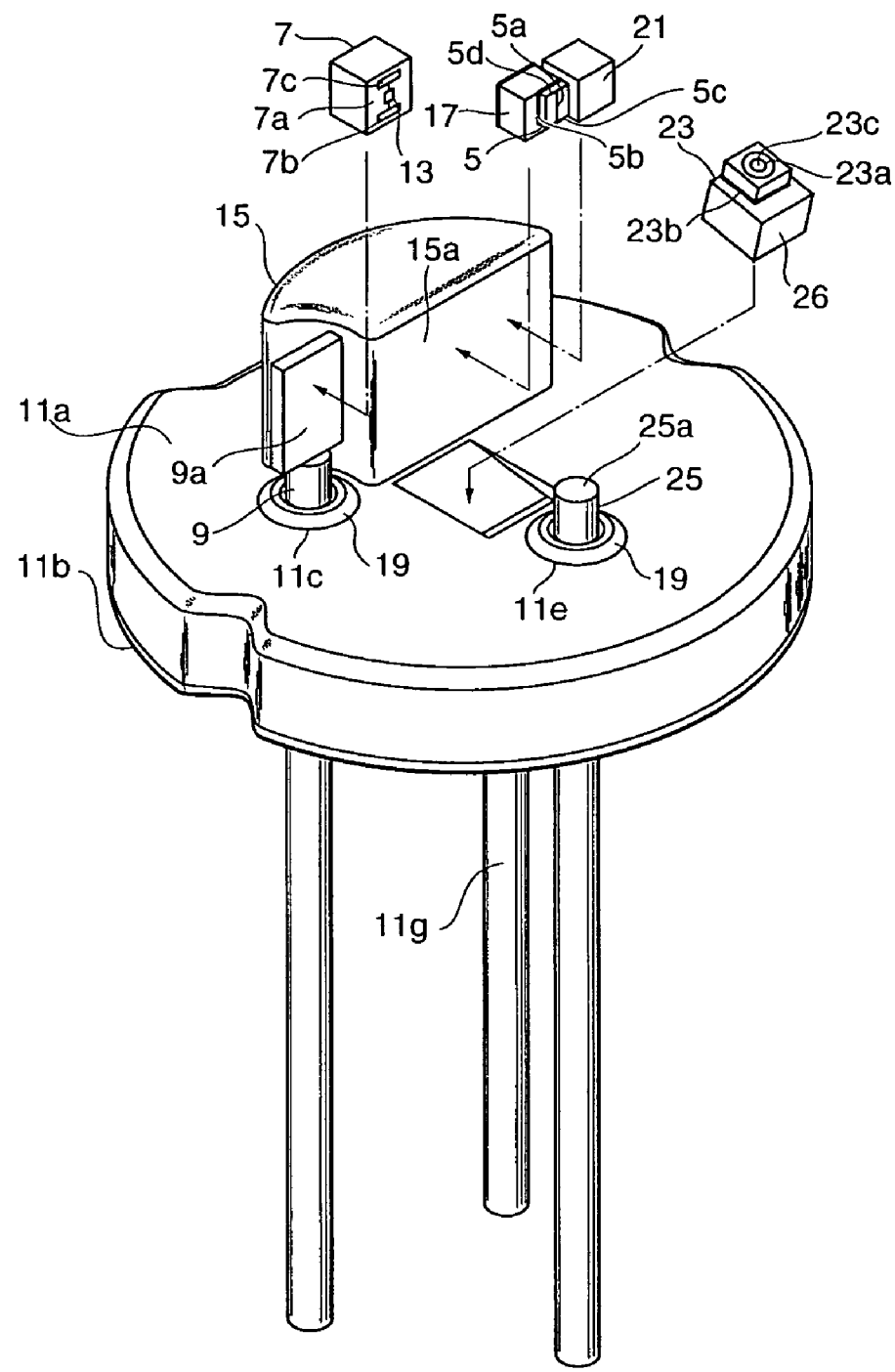
FIG. 2 is an exploded view of the first optical transmitting module.

FIG. 1 shows an optical transmitting module 1 according to the first embodiment of the present invention, and FIG. 2 is an exploded view of the optical transmitting module 1.

The optical transmitting module 1 includes a stem 3, a semiconductor laser diode 5, and an electronic device 7. The stem 3 provides a base 11, a plurality of leads 9, 25 and 11g, and a block 15. A side surface 15a of the base 15 mounts the laser diode 5 thereon. The electronic device 7, which may include a resistor 13 and has first and second electrodes on the primary surface thereof 7b and 7c, is fixed on the side surface of the lead 9. Respective terminals of the resistor 13 are connected to the first 7b and the second electrodes 7c of the electronic device 7. The first electrode 7b is connected to the lead 9, while the second electrode 7c thereof is connected to one terminal 5b of the laser diode 5.

The lead 9, in an end portion thereof, has a flat surface 9a where the electronic device 7 is mounted thereon and the first electrode 7b of the electronic device 7 may be electrically connected with a bonding-wire thereto. The lead 9 may includes a cylindrical portion 9b beneath the flat end portion, to which the first electrode 7b of the electronic device 7 may be wire-bonded. The flat end portion 9a may be processed by a press working. The shape of the flat end portion 9a is not restricted to that shown in figures. It may be applicable to cut the side of the lead and to form the flat portion.

Since a signal for driving the laser diode 5 is applied via the resistor 13 in the electronic device 7, impedance mismatching measured from the transmission line outside the optical transmitting module 1 can be reduced. Typical input impedance of the lead of the conventional CAN type package is about 25 Ω, while that of the semiconductor laser diode is about 5 Ω. Therefore, to set the resistance of the resistor 7 to be about 20 Ω will be equalize the input impedance of the transmitting module 1 to that of the transmission line connected to the lead 9.

The base 11 and the block 15 are made of metal such as SPC (Steel Plate Cold) or Kovar. The base 11 includes a plurality of holes 11c and 11e, through which the leads 9 and 25 penetrate. Between an inner surface of the hole and the lead are filled with sealant 19, such as seal glass. The base 11 supports the leads 9 and 25 through the sealant, which thermally and electrically isolates the lead 8 from the base 11. Further, the base 11 directly secures the lead 11g, therefore, the base 11 and the block 15 are electrically connected to the lead 11g.

The laser diode 5, having a rear facet 5c and a front facet 5d, is mounted on the side surface 15a of the block 15 via a heat sink 17. The heat sink, made of insulating material with good thermal conductivity such as aluminum nitride (AlN), provides metallic film 17a and 17b, for example made of AuSn eutectic alloy, on both surfaces thereof for the brazing. That is, the metallic film 17a on the primary surface of the heat sink 17 is provided for the die-bonding of the laser diode 5 and for the wire-bonding thereto, while the metallic film provided on the other surface is for the chip mounting of the heat sink 17 onto the block 15. The heat sink is not restricted to an insulating material. An electrically conductive material, such as copper tungsten (CuW) sintered material, may be applicable. When the electrically conductive heat sink 17 is applied, the one electrode 5b of the laser diode 5 is directly connected to the block 15, namely, to the base 11.

The transmitting module 1 may further include a conductive post 21, also mounted on the side surface 15a of the block 15 and immediate side of the laser diode 5. The post 21 is connected to the other electrode 5a of the laser diode 5. The post 21 may shorten a length of the bonding-wire to the laser diode 5, thereby reducing parasitic inductance inherently provided in a thin and long wire, which enhances the high frequency performance of the transmitting module 1.

The transmitting module 1 may further include a light-receiving device 23, such as photodiode, on the base 11 for monitoring optical output power of the laser diode 5. The photodiode 23 generates photo current corresponding to the optical output power of the laser diode 5. One electrode 23a of the photodiode 23 is connected to the lead 25 to output the photo current therefrom. The photodiode 23 is mounted on a sub-mount 26, which provides a wiring pattern, and the sub-mount 26 is placed on the base 11. The other electrode 23b of the photodiode 23 is directly connected to the base 11 with the wiring pattern and a bonding-wire.

The laser diode 5 is mounted on an upper side of the block 15, namely, a side opposite to the base 11, to make a space thereunder, where the photodiode 23 is positioned. A sticking-out length of the lead 25 from the base is shorter than that of the lead 9, which enables to make the maximum height of the bonding-wire connecting the photodiode 23 to the lead 25 to be small.

The side surface 9a of the lead 9, on which the electronic device 7 is mounted, and the side surface 15a of the block 15, on which the laser diode 5 is mounted, are both perpendicular to the base and substantially parallel with respect to each other. On the other hand, the photodiode 23 is placed beneath the laser diode 5, therefore, the bonding-wire between the electronic device 7 and the laser diode 5 does not interfere the other bonding-wire between the photodiode 23 and the lead 25. Similar relation may be applied between the bonding-wire connecting the post 21 and the laser diode 5, and that connecting the photodiode 23 and the lead 25. Moreover, the electronic device 7 is directly mounted on the side surface of the lead 9, and the lead 9 is offset from the optical axis of the laser diode 5, therefore, the bonding-wire connecting the lead 9 to the terminal 7b of the electronic device 7 also does not interfere the optical coupling between the laser diode 5 and the photodiode 23.

Figure 3:
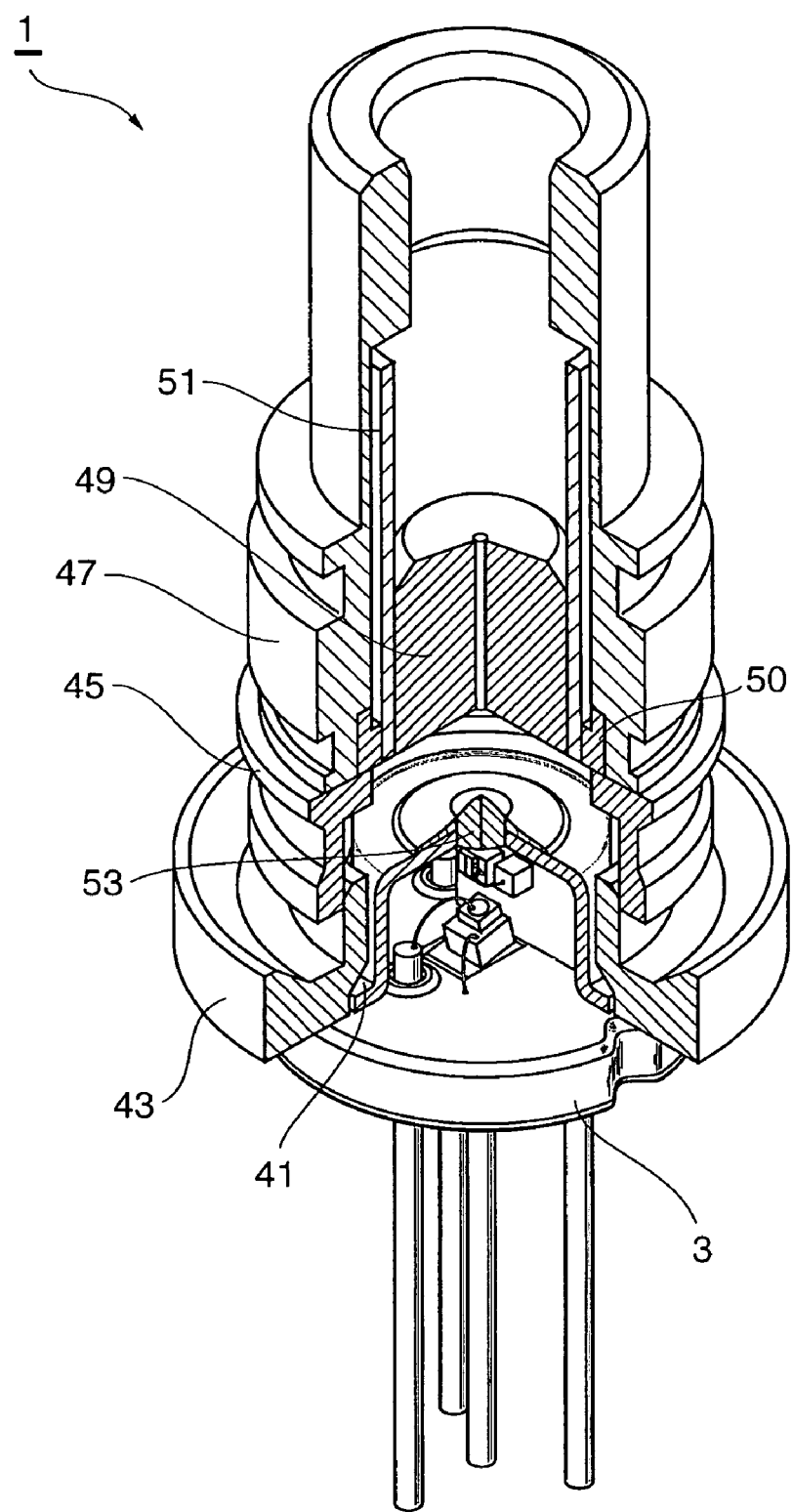
FIG. 3 is a perspective view showing a transmitting optical sub-assembly using the optical transmitting module of the first embodiment.

FIG. 3 shows an optical transmitting sub-assembly (TOSA) including the optical transmitting module 1. The TOSA includes a cap 41, accompanying with the stem 3, for enclosing optical and electrical devices therein, a welding member 43, an alignment member 45, and a sleeve assembly. The sleeve assembly includes a sleeve cover 47, a stub 49, a bush 50, and a sleeve 51. The cap 41 may provide a lens on a center and a top thereof for converging light emitted from the laser diode into a coupling fiber provided in a center of the stub 49. The welding member 43 is provided for the YAG-laser welding to the alignment member 45. That is, after optical alignment between the alignment member 45 and the welding member 43 along the optical axis by sliding the alignment member on the outer surface of the welding member, the YAG-laser welding is carried out therebetween for fixing them permanently. The split sleeve 51 secures the stub 49 in one end thereof, and a metallic bush 50 is press-fitted between the split sleeve 51 and the sleeve cover 47. Thus, the stub 49 is secured in the end of the split sleeve 51. The sleeve assembly is optically aligned with the laser diode by sliding the sleeve assembly on the end surface of the alignment member 45, which aligns with respect to each other within a plane intersecting the optical axis.

Second Embodiment

Figure 4:
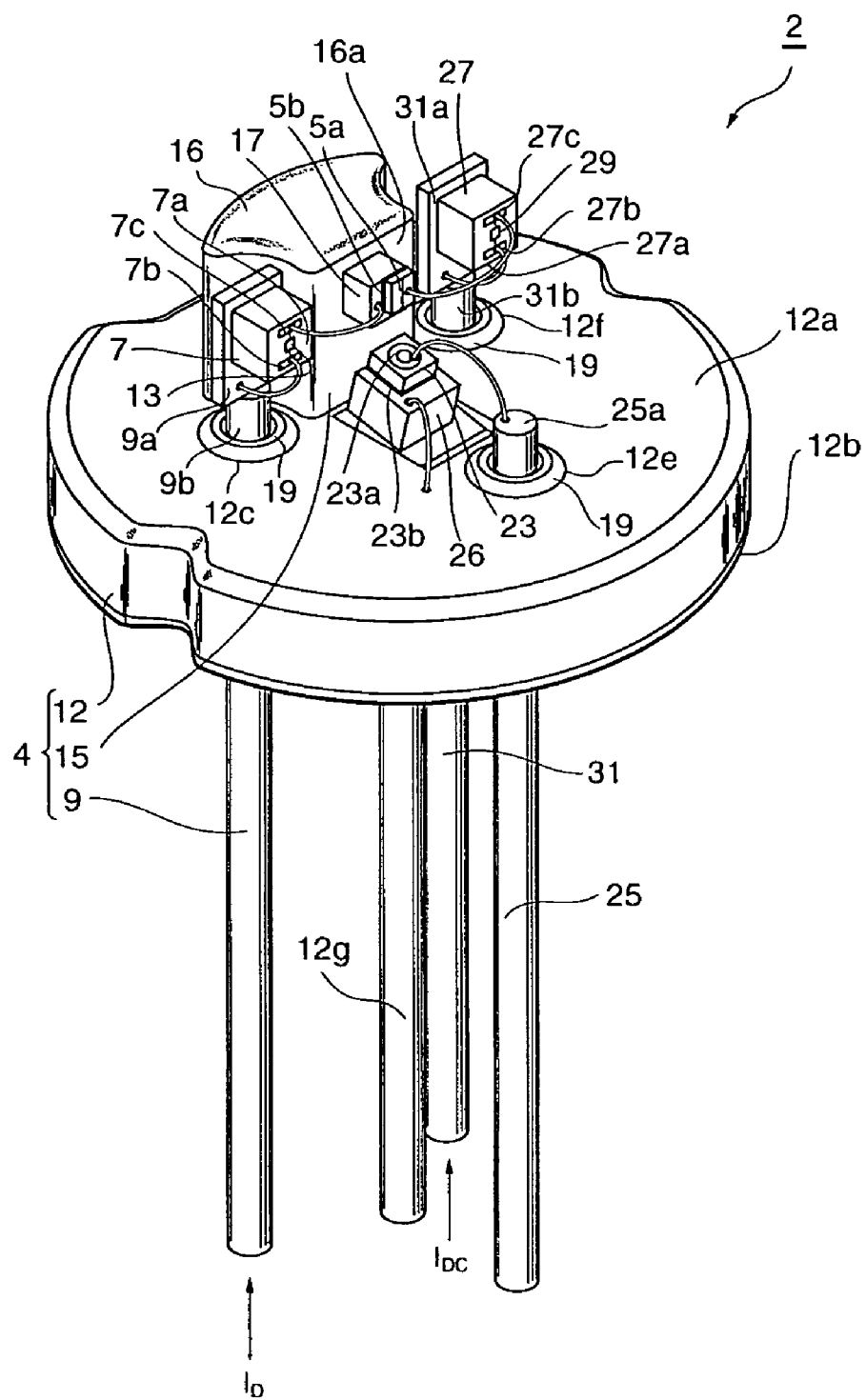
FIG. 4 is a perspective view showing an optical transmitting module according to the second embodiment of the present invention.
Figure 5:
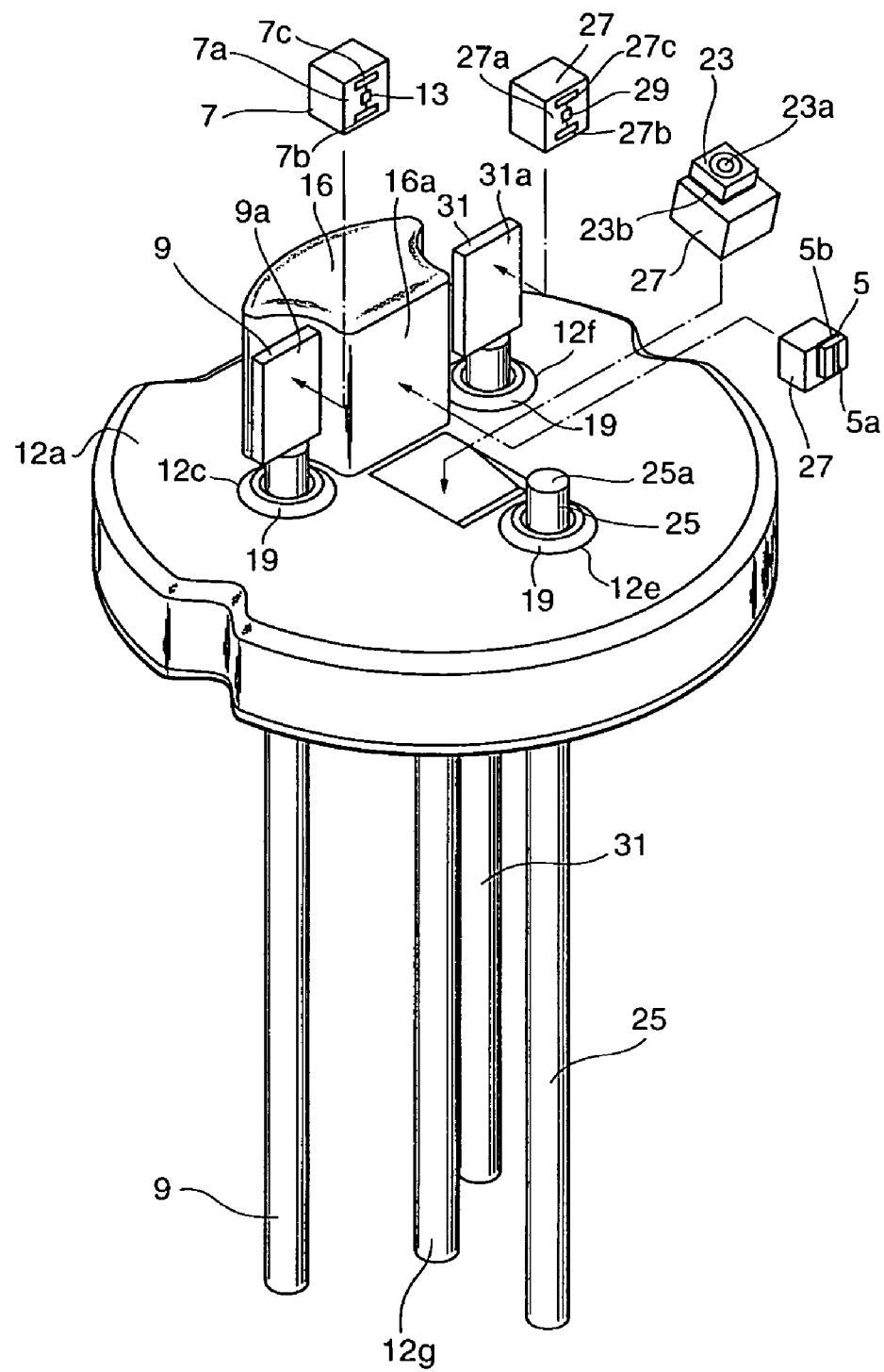
FIG. 5 is an exploded view of the optical transmitting module of the second embodiment.

FIG. 4 shows an optical transmitting module 2 according to the second embodiment of the present invention, and FIG. 5 is an exploded view of the transmitting module 2.

The optical transmitting module 2 includes, in addition to the module 1 shown in FIG. 1, a second electronic device 27, which may include another resistor 29, and is mounted on a lead 31 secured to the base 12. The second electronic device 27 also has first and second electrode 27b and 27c, and the resistor 29 is provided therebetween. The first electrode 27b is connected to the lead 31 and the second electrode 27c thereof is connected to the other electrode 5a of the laser diode 5. The laser diode 5 is also mounted on the block 16 on the base 12, similar to the first embodiment. However, the shape of the block 16 is different to that in the first embodiment shown in FIG. 1. That is, the block 16 avoids the position where the lead 31 passes.

In the optical transmitting module 2, the laser diode 5 is driven via the first resistor 13 in the electronic device 7 mounted on the lead 9 and the second resistor 29 in the electronic device 27 mounted on the lead 31. This configuration realizes that the laser diode 5 is driven by signals ID and IDC complementary with respect to each other, thereby enhancing the noise tolerance. The resistance of respective resistors are about 22.5 Ω, which may reduce the degradation due to the impedance mismatching between the optical transmitting module 2 and the transmission line.

The lead 31 has a similar structure to that of the lead 9. That is, the lead 31 is secured within the hole 12f with a sealant, such as seal glass, which electrically and thermally isolates the lead 31 from the base 12. Also, the lead 31 has a flat portion 31a at the end thereof, on which the electronic device 27 is mounted, and to which the first electrode 27b of the electronic device 27 is wire-bonded. Further, the lead 31b has a cylindrical portion 31b below the flat portion 31a. The first electrode 27b may be connected to the side of the cylindrical portion 31b thereof.

In the present embodiment, the laser diode 5 is positioned between two electronic devices 7 and 27. Moreover, mounting surfaces of respective devices, namely, the side surface 16a for the laser diode 5, the flat end portion of the lead 9, and the flat end portion of the lead 31, are substantially perpendicular to the base 12 and in parallel to each other. Therefore, this arrangement makes it easy to wire-bond between the laser diode 5 and the electronic device 7, and between the laser diode and the other electronic device 27. Further, the length of the bonding-wire can be reduced, which reduces the parasitic inductance.

The transmitting module 2 may also include the photodiode 23 for monitoring the output optical power of the laser diode 5 provided on the base 12 via the sub-mount 26 and electrically connected to the lead 25.

Also in the present embodiment, the photodiode 23 is disposed beneath the laser diode 5, namely, behind the rear facet of the laser diode along the optical axis thereof, and two electronic devices 7 and 27 sandwich the laser diode 5 therebetween. Therefore, the bonding-wires connecting the laser diode 5 to respective electronic devices 7 and 27 do not interfere the bonding-wire connecting the photodiode to the lead 25.

Two leads 9 and 31 are off to the optical axis of the laser diode 5, and the electrical connection between the electronic devices 7 and 27 and the corresponding leads 9 and 31 are carried out only on the flat end portion thereof. So, the optical coupling between the laser diode 5 and the photodiode 23 is not affected at all.

Third Embodiment

Figure 6A:
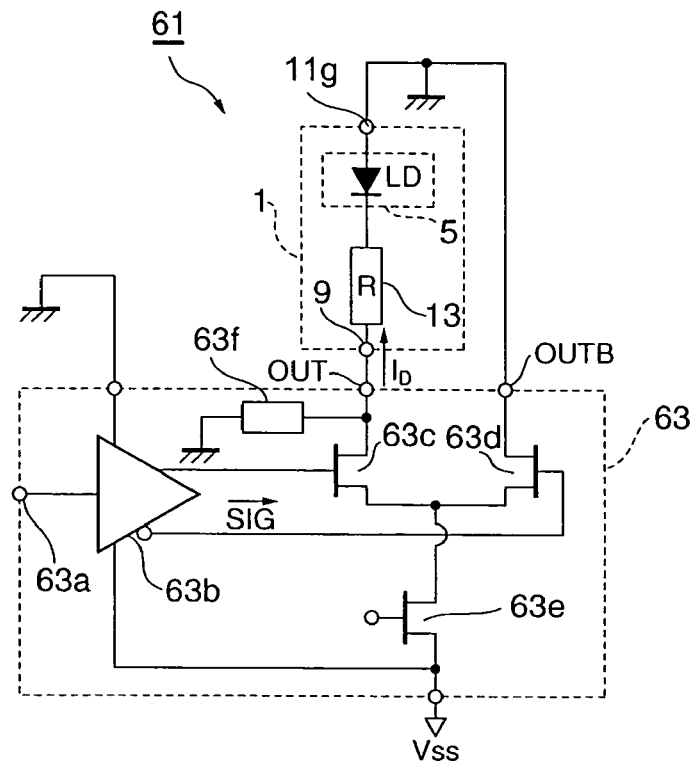
FIG. 6A is a circuit diagram provided for the optical transmitting module of the first embodiment.

The differential circuit can drive the optical transmitting module according to the first and the second embodiment described above. FIG. 6A shows a first circuit 61 for the first optical transmitting module shown in FIG. 1, while FIG. 6B shows a second circuit 71 for the second optical transmitting module shown in FIG. 4.

FIG. 6A provides a first optical transmitting module 1, and a first driver 63 that includes two output terminal OUT and OUTB, an input terminal 63a, an amplifier 63b, two transistors 63c and 63d, a modulation current source 63e, and a bias source 63f. The amplifier 63b, receiving the input signal from the input terminal 63a, generates a pair of signals SIG complementary to each other. The transistor 63c receives one of the paired signals, while the transistor 63d receives the other thereof. Although Field effect transistors (FETs) are shown in exemplary, the bipolar transistor may be applicable in the driver 63. The source of two transistors 63c and 63d are connected to the modulation current source 63e, while the drains thereof are appeared in output terminals OUT and OUTB, respectively.

The signal ID for driving the laser diode 5 is provided from the output terminal OUT of the driver 63 via the resistor 13 installed within in the optical transmitting module 1, the arrangement of the resistor 13 is shown in FIG. 1. Therefore, the impedance measured from the transmission line, on which the signal ID is propagated, becomes the sum of the resistance of the resistor 13 and the internal resistance of the laser diode 5, which is close to the transmission impedance of the transmission line, thereby reducing the influence due to impedance mismatching.

Figure 6B:
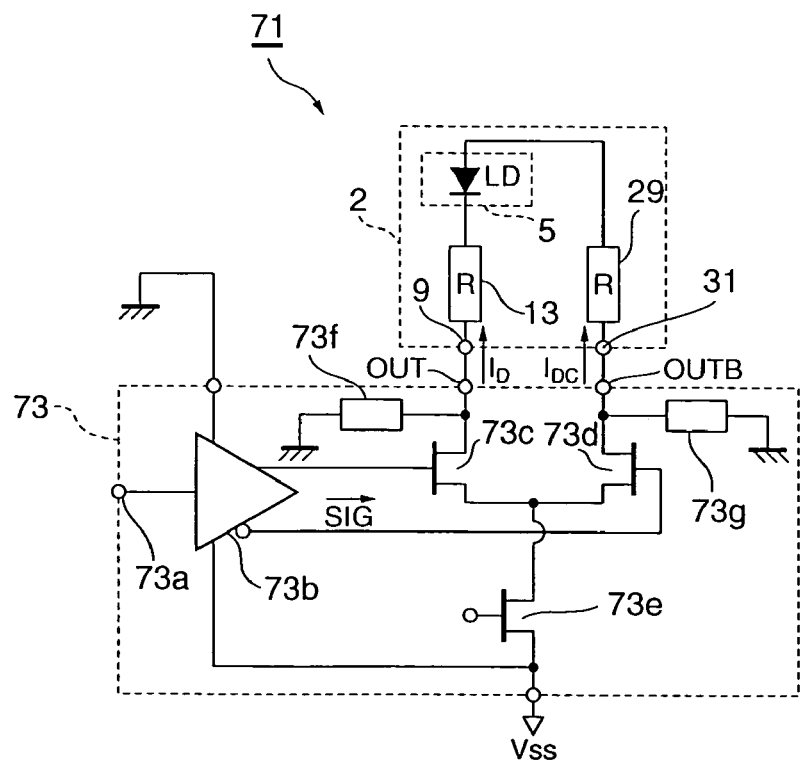
FIG. 6B is a circuit diagram provided for the optical transmitting module of the second embodiment.

The second circuit shown in FIG. 6B includes, in addition to the first circuit in FIG. 6A, another bias source 73g connected to the other output terminal OUTB. The laser diode 5 is applied the first driving signal $I_D$ with a normal phase from the lead 9 via the first resistor 13. Simultaneously, the laser diode 5 is applied the second driving signal $I_{DC}$ having an opposite phase from the lead 31 via the second resistor 29, which is called as differential driving.

In this configuration, not only the impedance at the lead 9 measured from the transmission line where the signal $I_D$ propagates, but also the impedance at the lead 31 measured from the transmission line on which the signal $I_{DC}$ propagates close to the transmission impedance of respective transmission lines. Therefore, the signal quality may be enhanced. Moreover, since the signals complementary to each other are applied to the laser diode 5, which makes an imaginary ground between two terminals OUT and OUTB, not only any ground lead is necessary but also the degradation in the signal quality due to unexpected fluctuation of the ground potential may be avoided.

Fourth Embodiment

From FIG. 7 to FIG. 10 show manufacturing procedure of the optical transmitting module 2, shown in FIG. 4, according to the present invention.

Figure 7:
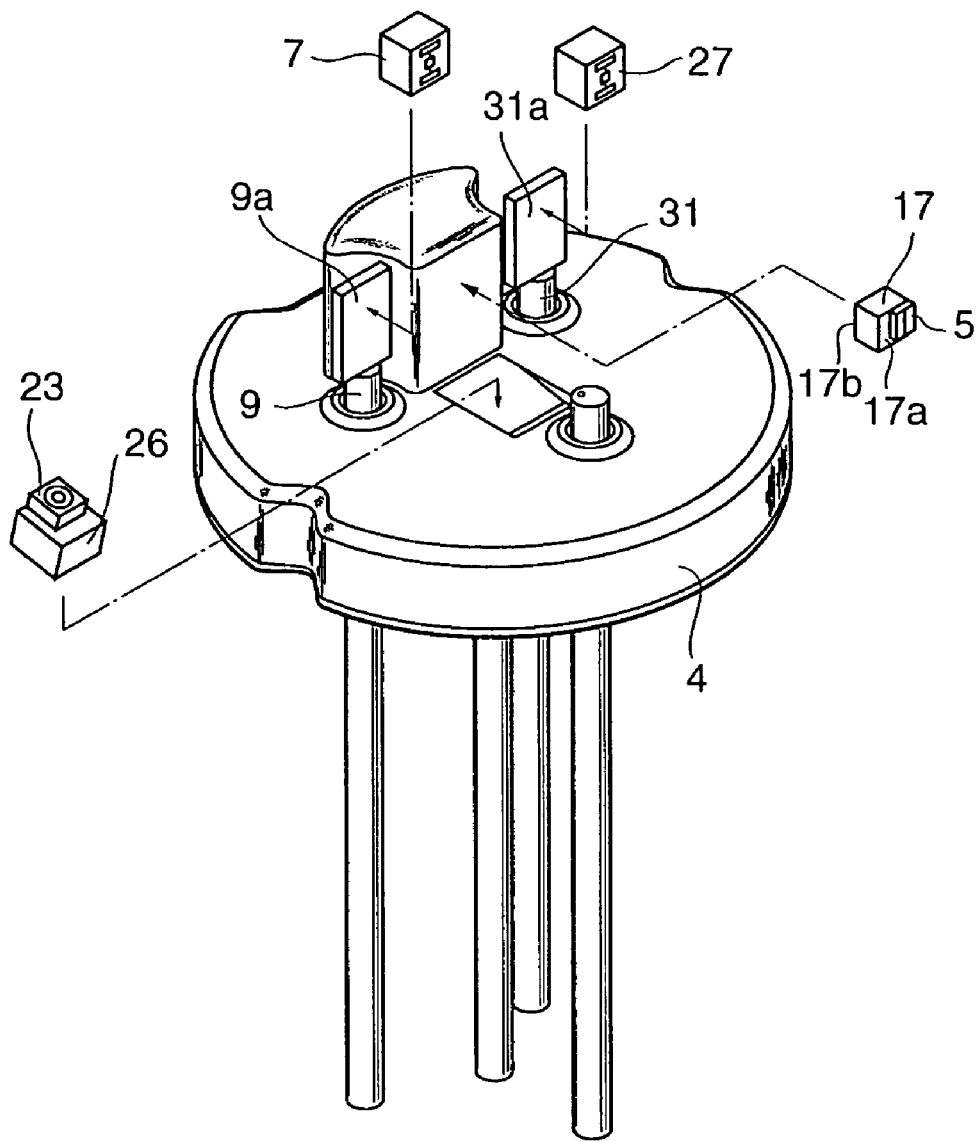
Figure 8:
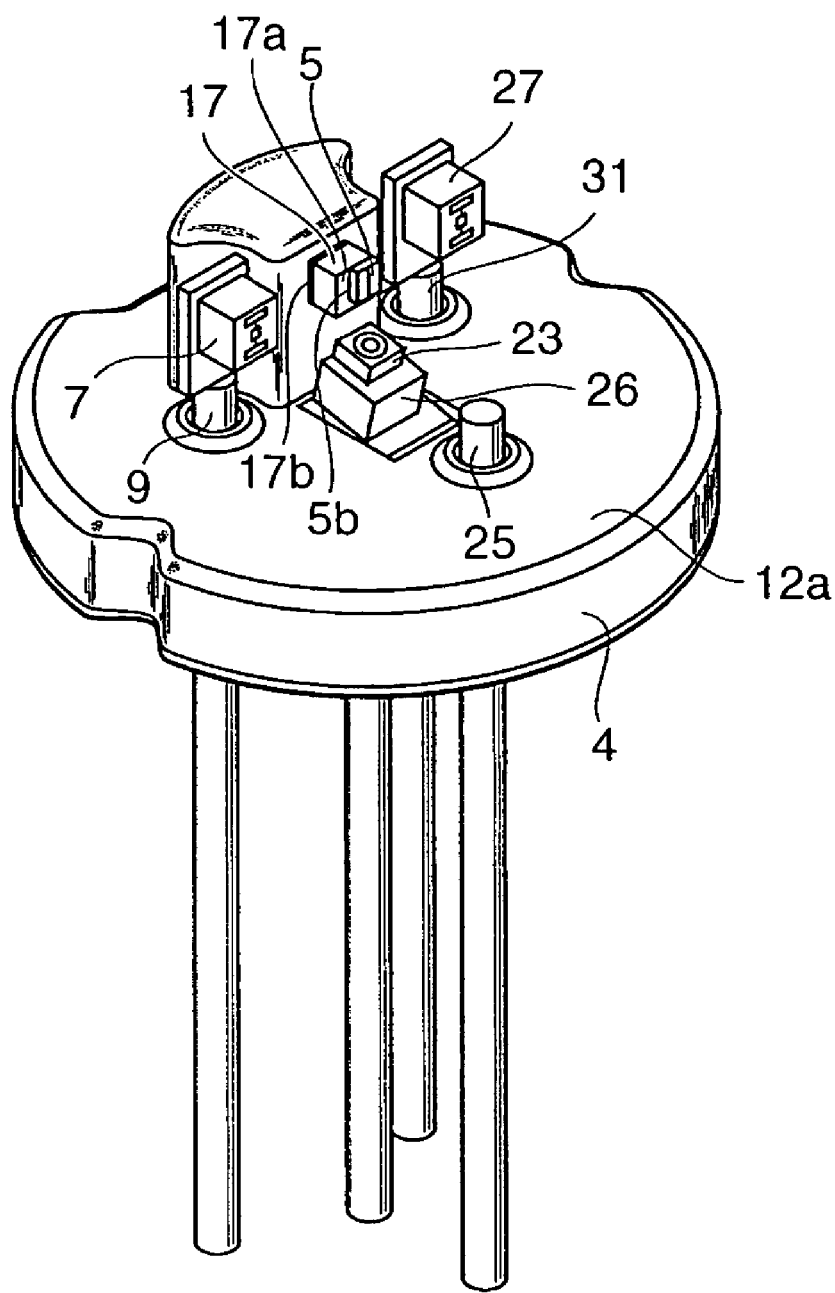
Figure 9:
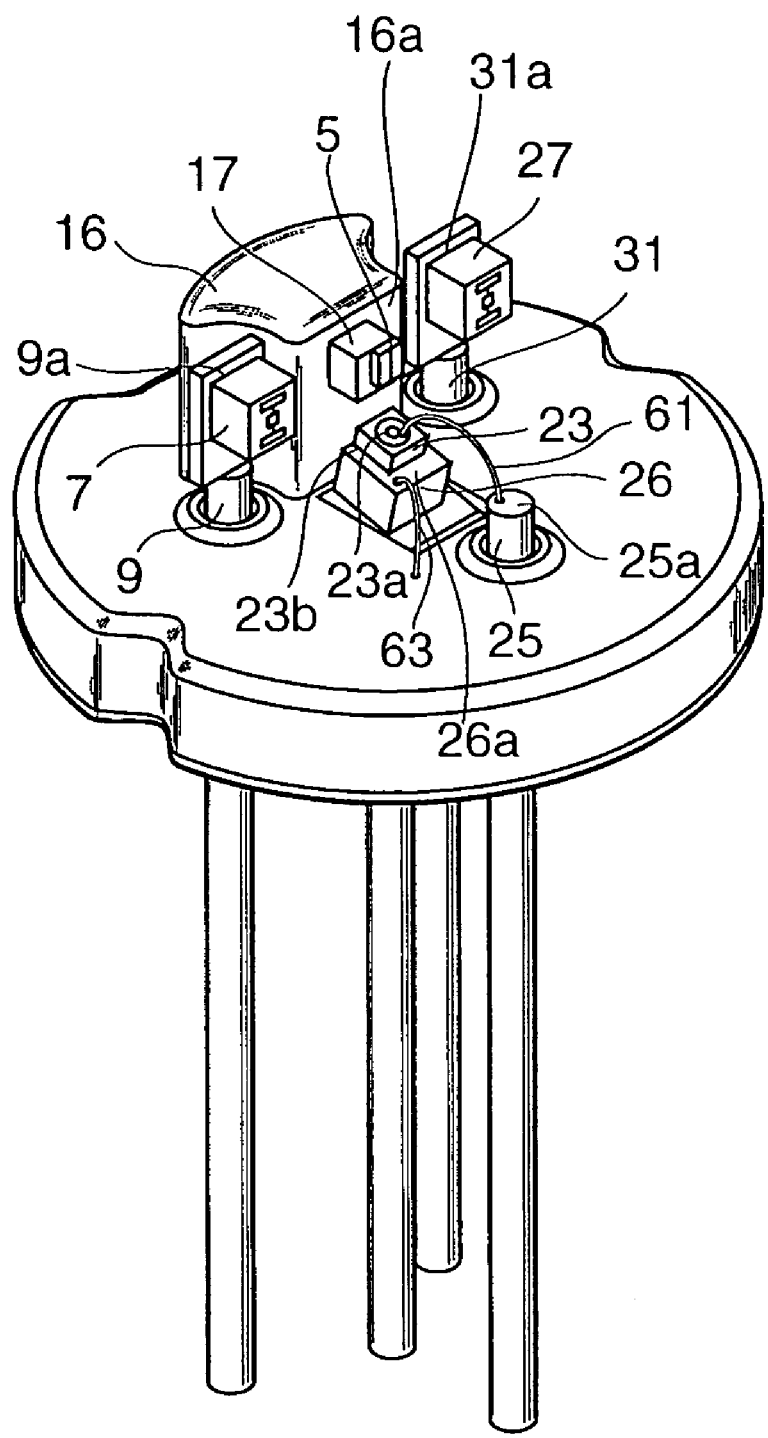

First, as shown in FIG. 7 and FIG. 8, optical and electrical components, such as the stem 4, the laser diode 5, two electronic devices 7 and 27, and the photodiode 23, are prepared. The photodiode 23 is mounted on the stem 4 via the sub-mount 26, the laser diode 5 is mounted on the side surface of the block 15 via the heat sink 17, and two resistors 7 and 27 are mounted on the flat end portion of respective leads 9 and 31. The heat sink 17 has metallic films 17a and 17b on both surfaces thereof, the film 17a in the primary surface is for the die-bonding of the laser diode 5, while that in the other surface is for chip-mounting of the heat sink 17 on the side surface of the block.

Next, one electrode 23a of the photodiode 23 is wire-bonded to the tip 25a of the lead 25 with a bonding-wire 61, which extends substantially in parallel to the base 12, and the metallic film 26a on the sub-mount 26 is wire-bonded to the base 12 with a bonding-wire 63. The order of the wire-bonding is commutative. The other electrode of the photodiode 23 is in contact with the metallic film 26a. The maximum levels of two bonding-wires 61 and 63 are preferably smaller than the level of the laser diode 5.

Figure 10:
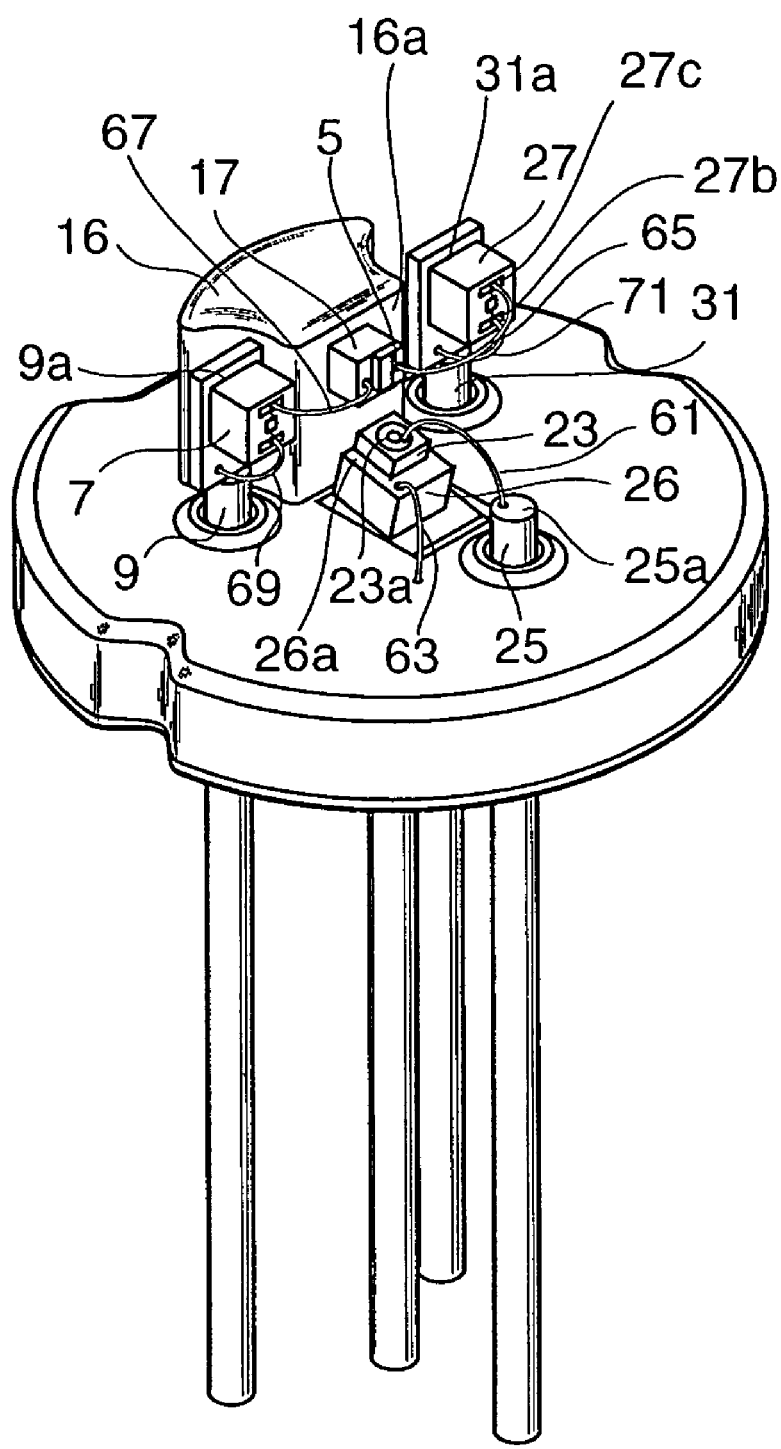

As shown in FIG. 10, some wire-bonding processes are carried out around the laser diode 5. That is, one electrode 5a of the laser diode, i.e., an upper electrode thereof, is wire-bonded to the second electrode 27c of the electronic device 27 with a bonding-wire 65. The metallic film 17a on the heat sink 17 is wire-bonded to the second electrode 7c of the electronic device 7 with a bonding-wire 67. Further, the first electrode 7b of the electronic device 7 is connected to the side surface 9a of the lead 9 with a bonding wire 69, and the first electrode 27b of the electronic device 27 is connected to the side surface 31a of the lead 31 with a bonding-wire 71. The sequences of these wire-bonding may also be commutative.

Finally, after completing these wire-bonding processes, the cap 41 covers devices mounted on the stem 4 by the resistance welding technique, which air-tightly seals the cavity formed by the stem 4 and the cap 41, within which devices, i.e., the laser diode 5, two electronic devices 7 and 27, and the photodiode 23, are installed. The cap 41 may provide the lens 53 on the top and the center thereof, the light emitted from the laser diode 5 may be output through the lens 53.

Fifth Embodiment

Thermal characteristics of the transmitting module according to the present invention will be described.

FIG. 11A is a perspective view showing a first simulation model, which corresponds to the present transmitting module, and FIG. 11B magnifies the primary portion of the transmitting module in FIG. 11A. The transmitting module includes the disk shaped base 11, which is made of ferrous metal such as SPC, having a diameter of 5.6 mm, and a block 15 is directly mounted thereon. The semiconductor laser diode 5 is mounted on the block 15 through the heat sink 17 made of aluminum nitride (AlN). On the lead 9 is mounted the chip resistor 7, one terminal 7c of which is connected to the upper surface of the heat sink 17 with the bonding-wire WIRE2, which is made of gold and has a diameter of 25 micron meters. The other terminal of the laser diode 5 is connected to the post 21 with a bonding-wire WIRE3.

FIG. 12A shows an arrangement showing a conventional module, by which a thermal simulation thereof was carried out, and FIG. 12B is a magnified view showing the primary portion of the conventional module. That is, the conventional module includes a disk shaped base 111 with a diameter of 5.6 mm and made of ferrous metal, a block 115 made of copper tungsten (CuW) sintered metal brazed to the base 111, a thin film resistor 107 and a laser diode 105. The thin film resistor 107 and the laser diode 105 are mounted on the block 115 via the heat sink 117 made of aluminum nitride (AlN). The base 111 holds the lead 110 with a glass sealant 119.

In the thermal simulation, an active layer of the laser diodes, 5 and 105, and the resistors, 7 and 107, function as a heat generating source. From Table 1 to Table 6 list the thermal conductivity, the heat transfer rate, and thermal resistance of materials used in the transmitting module and used in the present thermal simulation.

TABLE 1

Thermal conductivity of materials applied in the present transmitting module

| Element | Material | Thermal conductivity (W/m/K) |
|---|---|---|
| Laser Diode | InP | 68 |
| Heat sink | AlN | 170 |
| Post | CuW | 180 |
| Chip resistor | Almina | 29.4 |
| Stem | SPC | 79 |
| Lead | Fe—Ni Alloy | 14.7 |
| Seal glass | Glass | 0.75 |

TABLE 2

Heat transfer rate to ambience for components applied in the present transmitting module

| Location | Heat transfer rate (W/m$^2$/K) |
|---|---|
| Top of laser diode | 2.80 |
| Front, side and back of laser diode | 3.85 |
| Top of heat sink | 2.75 |
| Side of heat sink | 2.93 |
| Post | 2.57 |
| Chip resistor | 4.29 |
| Top of block | 2.32 |
| Side and back of block | 1.90 |
| Inner and outer surface of base | 1.08 |
| Lead | 3.44 |
| Bonding wire | 4.11 |

TABLE 3

Thermal resistance between components provided in the present transmitting module

| Location | Material | Thermal resistance (K/W) |
|---|---|---|
| Laser diode/Heat sink | AuSn solder | 1.168 |
| Heat sink/Stem | AuSn solder | 0.398 |

TABLE 4

Thermal conductivity of materials applied in the conventional module

| Element | Material | Thermal conductivity (W/m/K) |
|---|---|---|
| Laser Diode | InP | 68 |
| Heat sink | AlN | 170 |
| Thin film resistor | TaN | 29.4 |
| Block | CuW | 180 |
| Base | SPC | 79 |
| Lead | Fe—Ni Alloy | 14.7 |
| Seal glass | Glass | 0.75 |

TABLE 5

Heat transfer rate to the ambience for components provided in the conventional module

| Location | Heat transfer rate (W/m$^2$/K) |
|---|---|
| Top of laser diode | 2.80 |
| Front, side and back of laser diode | 3.85 |
| Top of heat sink | 2.36 |
| Side of heat sink | 2.58 |
| Top of block | 2.03 |
| Side of block | 1.88 |
| Back of block | 0.86 |
| Inner and outer surface of base | 1.08 |

TABLE 6

Thermal resistance between elements applied in the present transmitting module

| Location | Material | Thermal resistance (K/W) |
|---|---|---|
| Laser diode/Heat sink | AuSn solder | 1.168 |
| Heat sink/Block | AuSn solder | 0.129 |
| Block/Stem | Silver solder | 0.023 |

The simulation is performed assuming that the ambient temperature of 75° C., and the outer surface of the base 11 and 111, and that of leads 9 and 119, are set to be 75° C. as a boundary condition. The laser diode 5 and 105 is driven by the direct modulation mode, i.e., the laser diode 5 and 105 is modulated such that the forward current of 100 mA flows when biased by 2 V. The equivalent resistance of the laser diode becomes about 5 ohm. The resistance of the chip resistor 7 and that of the thin film resistor 107 are set to be 20 ohm, respectively. Under the condition above described, the active layer of the laser diode generates heat of 0.2 W, and respective resistors also generate heat of 0.2 W.

The heat transfer rate listed in Table 2 and Table 5 is values corresponding to the dry nitrogen filled within the hermetic sealed module, and to the ambient air. The nitrogen and the air are regarded in the natural convection. On the other hand, the thermal resistance between elements, such as between the laser diode and the heat sink, between the heat sink and the block, and between the copper tungsten block and the base, are taken into consideration in the simulation. That is, the former two cases are bonded with AuSn solder, while the last case is bonded with the silver-alloy brazing.

FIG. 13A is a result for the conventional module, and FIG. 13B also shows a result for the conventional module, but assuming that, although the block and the base are formed by independent components in the practical module, the block and the base are integrally formed from ferrous metal, SPC. FIG. 13C is a result for the present module, and FIG. 13D is a result assuming the case that the chip resistor 7 does not generate any heat.

First, comparing FIG. 13A to FIG. 13B, the temperature of the laser diode increases when the block and the base have an integrated structure made of SPC. As shown in figures, the difference of 1.7° C. (96.42° C. in FIG. 13A, while 98.15 ° C. in FIG. 13B) may occur. When independent members are used for the block and the base, the block made of CuW has relatively larger thermal conductivity and heat transfer rate. However, CuW can not be used for the base due to its brittleness. Therefore, SPC or Kovar, having relatively poor thermal conductivity and heat transfer rate, must be used for the base. On the other hand, as shown in FIG. 13C, even in the integrated configuration of the base and the block made of SPC, the increase of the temperature of the laser diode may be suppressed (95.65 ° C. in FIG. 13C and 96.42 ° C. in FIG. 13A).

Comparing FIG. 13C and FIG. 13D, it is understood that, since the temperature of the laser diode 5 is substantially equal in both figures, the heat generated at the chip resistance 7 may be isolated by the seal glass filled within the gap of the through holes for the lead 9. Generally, characteristics of the laser diode, such as the threshold current and the slope efficiency, depend on temperatures. The threshold current increases and the slope efficiency decreases at high temperatures. Therefore, a larger current may be necessary to emit light with a constant output power. It is necessary to suppress the temperature increase of the laser diode in order to maintain the quality and the quantity of the output light of the optical transmitting module.

In this aspect of the temperature increase of the laser diode, the conventional module has a disadvantage, because the thin film resistor 107 is formed on the heat sink 117 on which the laser diode is also mounted. The heat generated by the thin film resistor 107 may directly affect and be transferred to the laser diode 5. To compensate this thermal disadvantage of the heat transfer from the thin film resistor, the conventional module uses the base made of CuW having a good thermal conductivity and the sliver-alloy brazing in order to dissipate heat generated by the thin film resistor.

On the other hand in the present transmitting module, the chip resistor 7 is mounted on the lead thermally isolated from the block by the seal glass filled in the gap in the through hole of the base 11. This arrangement of the chip resistor 7 being mounted on the lead 9 makes it possible for the laser diode 5 to maintain the superior thermal performance. The base 11 integrated with the block 15 can be formed easily by the stamping, the machining, or the MIM (Metal Injection Mold) method.

While the invention has been particularly shown and described with respect to illustrative and preferable embodiments thereof, it will be understood by those skilled in the art that the foregoing and other changes in arrangement and details may be made therein without departing from the spirit and scope of the invention which should be limited only by the scope of the following claims.

What is claimed is:

1. An optical transmitting module, comprising:
a semiconductor laser diode with impedance, the laser diode having a first electrode and a second electrode;
a first resistor with first resistance, the first resistor having a first terminal and a second terminal;
a second resistor with second resistance, the second resistor having a first terminal and a second terminal; and
a CAN package for enclosing said laser diode, said first resistor and said second resistor, said package including a metal base, a metal block provided on said metal base and having a side surface for mounting said laser diode through a heat sink made of insulating material with a thermal conductivity, and first and second leads each secured to said metal base and electrically isolated from said metal base, said first and second leads each having impedance and a flat side surface in an end portion thereof for mounting said first and second resistors thereon, respectively, said first terminal of said first resistor being connected to said first electrode of said laser diode and said second terminal of said first resistor being connected to said first lead, said first terminal of said second resistor being connected to said second electrode of said laser diode and said second terminal of said second resistor being connected to said second lead,
wherein said laser diode is thermally isolated from said first and second resistors, and
wherein the sum of the impedance of the laser diode, the resistance of the first resistor and the impedance of the first lead is equalized to match the input impedance of the optical transmitting module to the transmission line connected to the first lead, and the sum of the impedance of the laser diode, the resistance of the second resistor and the impedance of the second lead is equalized to match the input impedance of the optical transmitting module to the transmission line connected to the second lead.

2. The optical transmitting module according to claim 1, wherein said flat side surface of said first lead and said side surface of said block are substantially in parallel to each other.

3. The optical transmitting module according to claim 1, wherein said block and said base are integrally formed.

4. The optical transmitting module according to claim 3, wherein said base and said block are made of a material selected from either SPC and Kovar.

5. The optical transmitting module according to claim 1, further comprising a heat sink made of insulating material with a metal film provided on one surface thereof, said laser diode being mounted on said block via said heat sink such that said first electrode of said laser diode faces to and fixed to said metal film, said first terminal of said first resistor being connected to said metal film.

6. The optical transmitting module according to claim 1, wherein said flat side surface of said second lead and said side surface of said block are substantially in parallel to each other.

7. The optical transmitting module according to claim 1, further including two drive signals complementary to each other for differentially driving said laser diode, said two drive signals being provided to said laser diode through said first and second leads and through said first and second resistors, respectively.

* * * * *